(12) United States Patent
Im et al.

(10) Patent No.: US 7,564,732 B2
(45) Date of Patent: Jul. 21, 2009

(54) INTERNAL VOLTAGE GENERATION CIRCUIT FOR SEMICONDUCTOR DEVICE

(75) Inventors: Jae-Hyuk Im, Kyoungki-do (KR); Jae-Bum Ko, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 125 days.

(21) Appl. No.: 11/646,099

(22) Filed: Dec. 27, 2006

(65) Prior Publication Data

US 2007/0263468 A1    Nov. 15, 2007

(30) Foreign Application Priority Data

May 10, 2006    (KR)    ............. 10-2006-0041902

(51) Int. Cl.
GIIC 5/14    (2006.01)
(52) U.S. Cl. ............ 365/226; 365/227; 365/228; 365/229
(58) Field of Classification Search ............ 365/226, 365/227, 228, 229
See application file for complete search history.

(56) References Cited

U.S. PATENT DOCUMENTS

| | | | | |
|---|---|---|---|---|
| 5,848,004 | A * | 12/1998 | Dosaka et al. | 365/230.03 |
| 6,150,860 | A | 11/2000 | Chun | |
| 6,297,624 | B1 * | 10/2001 | Mitsui et al. | 323/316 |
| 6,385,119 | B2 * | 5/2002 | Kobayashi et al. | 365/227 |
| 6,424,585 | B1 * | 7/2002 | Ooishi | 365/226 |
| 6,477,100 | B2 * | 11/2002 | Takemura et al. | 365/207 |
| 6,492,863 | B2 * | 12/2002 | Kono et al. | 327/538 |
| 6,522,193 | B2 | 2/2003 | Shin | |
| 6,635,934 | B2 * | 10/2003 | Hidaka | 257/369 |
| 6,680,875 | B2 * | 1/2004 | Horiguchi et al. | 365/226 |
| 6,717,460 | B2 * | 4/2004 | Yamauchi et al. | 327/544 |
| 6,958,947 | B2 | 10/2005 | Park et al. | |
| 7,030,681 | B2 * | 4/2006 | Yamazaki et al. | 327/534 |
| 7,046,074 | B2 | 5/2006 | Jang | |
| 7,082,074 | B2 * | 7/2006 | Horiguchi et al. | 365/226 |
| 7,123,536 | B2 * | 10/2006 | Kang | 365/226 |
| 7,149,131 | B2 * | 12/2006 | Choi et al. | 365/189.09 |
| 7,227,794 | B2 * | 6/2007 | Kang | 365/193 |
| 7,250,811 | B2 * | 7/2007 | Kim | 327/538 |
| 7,289,377 | B2 * | 10/2007 | Do | 365/189.09 |
| 7,301,848 | B2 * | 11/2007 | Jin | 365/226 |
| 7,319,361 | B2 * | 1/2008 | Jin | 327/543 |
| 7,391,658 | B2 * | 6/2008 | Do | 365/189.09 |
| 7,414,897 | B2 * | 8/2008 | Do | 365/189.09 |
| 2004/0155701 | A1 | 8/2004 | Kim et al. | |
| 2006/0140020 | A1 | 6/2006 | Do | |

FOREIGN PATENT DOCUMENTS

JP    2003-101396    4/2003
KR    1999-0084907    12/1999

* cited by examiner

*Primary Examiner*—Viet Q Nguyen
(74) *Attorney, Agent, or Firm*—Blakely, Sokoloff, Taylor & Zafman LLP

(57) ABSTRACT

Provided is an internal voltage generation circuit for generating an internal voltage used in a semiconductor device. The internal voltage generation circuit includes a standby internal voltage generator which is driven during a standby operation and an active operation and supplies a voltage to a core voltage end, a first active internal voltage generator for supplying a voltage to the core voltage end in response to an active signal activated during the active operation, and a second active internal voltage generator which is driven only for a predetermined time period in response to the active signal, and supplies a voltage to the core voltage end.

16 Claims, 4 Drawing Sheets

INTERNAL VOLTAGE GENERATION CIRCUIT FOR SEMICONDUCTOR DEVICE

CROSS-REFERENCE TO RELATED APPLICATION

The present invention claims priority of Korean patent application number 10-2006-0041902, filed on May 10, 2006, which is incorporated by reference in its entirety.

BACKGROUND OF THE INVENTION

The present invention relates to semiconductor design technologies; and, more particularly, to an internal voltage generation circuit for generating an internal voltage used in a semiconductor device.

Generally, a cell size within a semiconductor chip is gradually becoming smaller as the chip is highly integrated. Also, an operating voltage is being lowered due to such a small-sized cell. Most of semiconductor chips incorporate therein an internal voltage generation circuit for generating an internal voltage to thereby supply voltages required for operating internal circuits of the chip themselves. The internal voltages generated by the internal voltage generation circuit include a word line rise voltage VPP, a core voltage VCORE applied to a cell and Bit Line Sense Amp (BLSA), a voltage VPERI fed to peripheral circuits, and so on.

FIG. 1 shows a block diagram for describing a conventional internal voltage generation circuit.

Referring to FIG. 1, the internal voltage generation circuit includes a high voltage generator 10 connected between an external voltage end VCC and a ground voltage end VSS, a core voltage generator 20, and a cell 30 receiving a core voltage VCORE generated by the core voltage generator 20. Here, the cell 30 illustrates a representative one of various internal circuits accepting the core voltage VCORE.

The high voltage generator 10 generates a high voltage needed for a word line WL, and the core voltage generator 20 generally serves to generate a core voltage VCORE required for the cell 30, the BLSA, and so on.

FIG. 2 is a detailed block diagram for describing the core voltage generator 20 depicted in FIG. 1.

Referring to FIG. 2, the core voltage generator 20 is provided with an active internal voltage generator 20a and a standby internal voltage generator 20b.

The standby internal voltage generator 20b is always operated in order to maintain an electric potential of a core voltage VCORE regardless of the operation state of a semiconductor device. And, the active internal voltage generator 20a is operated for securing the core voltage VCORE with a large driving force which is a voltage generated in response to an active signal active_flag activated during an active operation.

Here, the active signal active_flag refers to a signal which becomes active when the core voltage VCORE is much used, that is, in the state that the word line WL is boosted, including both a self refresh state and an auto refresh state of the semiconductor device.

The core voltage VCORE thus generated is fed to the cell 30 and used as a power supply voltage. The cell 30 shows a representative one of various internal circuits receiving the core voltage VCORE, as in FIG. 1.

FIG. 3 is a detailed circuit diagram for explaining the core voltage generator 20 depicted in FIG. 2.

With reference to FIG. 3, the core voltage generator 20 is constituted by a reference voltage generator 20c, a standby internal voltage generator 20b, and an active internal voltage generator 20a.

The reference voltage generator 20c is to generate a reference voltage VREF by using an external voltage VCC applied thereto. Since this is already well-known in the art, details thereof will be omitted here for simplicity.

The standby internal voltage generator 20b compares the reference voltage VREF with the core voltage VCORE to boost the core voltage VCORE when it is less than the reference voltage VREF, and is constituted by a voltage comparator 21b composed of a current mirror type differential amplifier, and a pull-up driver PM1.

The voltage comparator 21b provided in the standby internal voltage generator 20b is composed of an NMOS transistor NM1 for taking a signal v_vias for always enabling the standby internal voltage generator 20b via its gate, an NMOS transistor NM2 connected between a node N1 and the NMOS transistor NM1 for receiving the core voltage VCORE via its gate, a PMOS transistor PM2 coupled between an external voltage end VCC and the node N1 for accepting a voltage level of the node N1 via its gate, a PMOS transistor PM3 coupled between the external voltage end VCC and a node N2 for accepting the voltage level of the node N1 via its gate, and an NMOS transistor NM3 connected between the node N2 and the NMOS transistor NM1 for taking the reference voltage VREF via its gate. And, the pull-up driver PM1 is composed of a PMOS transistor connected between the external voltage end VCC and the core voltage end for receiving a voltage of an output end of the voltage comparator 21b, i.e., the node N2, via its gate.

The active internal voltage generator 20a serves to secure a greater driving force during an active operation, and is constituted by a voltage comparator 21a for comparing the reference voltage VREF with the core voltage VCORE in response to an active signal active_flag, a pull-up driver PM4, and a switch PM5 for turning off the pull-up driver PM4.

The voltage comparator 21a and the pull-up driver PM4 of the active internal voltage generator 20a are identical in constitution to the voltage comparator 21b and the pull-up driver PM1 of the standby internal voltage generator 20b except that the generator 20a employs the active signal active_flag instead of the enable signal v_vias used in the standby internal voltage generator 20b, and further has the switch PM5. The switch PM5 is coupled between the external voltage end VCC and an output end (a node N3) of the voltage comparator 21a, and composed of a PMOS transistor for receiving the active signal active_flag via its gate.

Now, an operation of the core voltage generator 20 will be described in detail. First of all, in response to the enable signal V_bias during a standby operation, the voltage comparator 21b of the standby internal voltage generator 20b generator is enabled, and compares the core voltage VCORE with the reference voltage VREF to output a logic low level if the core voltage VCORE is lower than the reference voltage VREF. Thus, the pull-up driver PM1 is turned on, so that the core voltage VCORE increases. Further, if the core voltage VCORE is higher than the reference voltage VREF, the voltage comparator 21b provides a logic high level. In response to the logic high level, the pull-up driver PM1 is turned off, which stops the increase of the core voltage VCORE.

Meanwhile, when the active signal active_flag transitions to a logic high level during an active operation, the active internal voltage generator 20a is driven. The active internal voltage generator 20a performs the same operation as the standby internal voltage generator 20b, thereby ensuring the core voltage VCORE with a greater driving force.

In conclusion, the core voltage generator 20 enables the standby internal voltage generator 20b to be driven during the standby operation, while enabling both the standby internal voltage generator 20b and the active internal voltage generator 20a to be driven during the active operation, so that a greater driving force can be secured. This prior art configuration decreases a power consumption by making the driving force different depending on the operation state of the semiconductor device.

However, power draw on the core voltage VCORE is high only during a certain time period after the active signal has transitioned from the logic low level to the logic high level, not the entire time during which the signal is at the logic high level.

Because of this, the driving of the active internal voltage generator 20a for a certain time period after the active signal has transited from the logic low level to the logic high level causes larger power consumption than needed.

SUMMARY OF THE INVENTION

It is, therefore, a primary object of the present invention to provide an internal voltage generator for a semiconductor device for generating a different internal voltage for an interval ("section") where power consumption is large or small during an active operation.

In accordance with one aspect of the present invention, there is provided an internal voltage generation circuit for use in a semiconductor device, including: a standby internal voltage generator which is driven during a standby operation and an active operation, and supplies a voltage to a core voltage end; a first active internal voltage generator for supplying a voltage to the core voltage end in response to an active signal activated during the active operation; and a second active internal voltage generator which is driven only for a predetermined time period in response to the active signal, and supplies a voltage to the core voltage end.

In accordance with another aspect of the present invention, there is provided an internal voltage generation method for use in a semiconductor device, including the steps of: supplying a voltage to a supply end by driving a standby internal voltage generator, and a first and a second active internal voltage generators during an active operation; and stopping the driving of the second active internal voltage generator after a predetermined time period, and supplying a voltage to the supply end by driving the standby internal voltage generator and the first active internal voltage generator.

The other objectives and advantages of the invention will be understood by the following description and will also be appreciated by the embodiments of the invention more clearly. Further, the objectives and advantages of the invention will readily be seen that they can be realized by the means and its combination specified in the claims.

DESCRIPTION OF SPECIFIC EMBODIMENTS

Hereinafter, preferred embodiments of the present invention will be set forth in detail with reference to the accompanying drawings to the extent that a person skilled in the art can easily carry out the invention.

Figure 4:
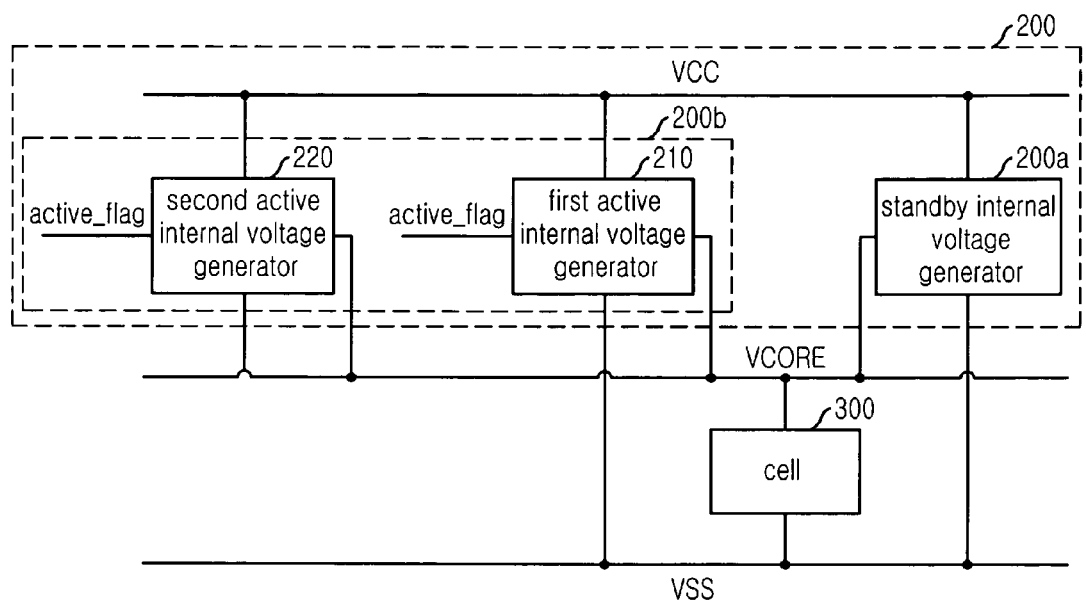
FIG. 4 illustrates a block diagram for explaining a core voltage generator in accordance with a preferred embodiment of the present invention.

FIG. 4 illustrates a block diagram for explaining a core voltage generator in accordance with a preferred embodiment of the present invention.

Referring to FIG. 4, the core voltage generator 200 is provided with an active internal voltage generator 200b composed of a first and a second active internal voltage generators 210 and 220, and a standby internal voltage generator 200a.

The standby internal voltage generator 200a is always operated in order to maintain an electric potential of a core voltage VCORE regardless of the operation state of a semiconductor device. And, the first and the second active internal voltage generators 210 and 220 are operated for securing the core voltage VCORE with a large driving force which is a voltage generated in response to an active signal active_flag activated during an active operation. Here, the first active internal voltage generator 210 is always operated during the active operation, while the second active internal voltage generator 220 is driven only for a certain time period in response to the active signal active_flag.

In other words, during the active operation, all of the standby internal voltage generator 200a and the first and the second active internal voltage generators 210 and 220 are driven, thereby generating an internal voltage needed in a section where the core voltage VCORE is much used. After a certain time period, the driving of the second active internal voltage generator 220 is stopped, and only the standby internal voltage generator 220a and the first internal voltage generator 210 are driven, to thereby generate an internal voltage. The internal voltage thus generated is fed to various internal circuits of the semiconductor device and used as a power supply voltage of each circuit.

Figure 5:
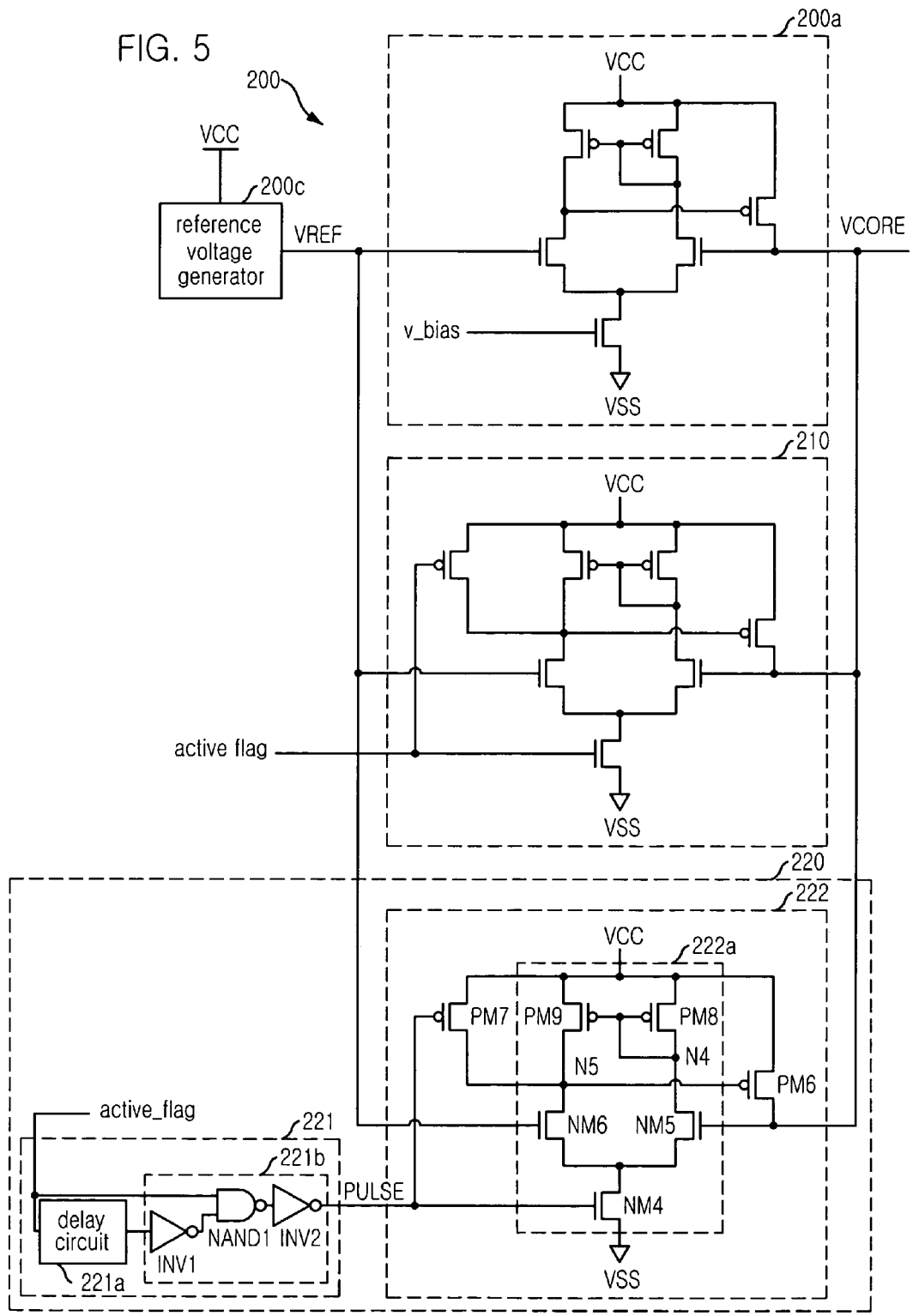
FIG. 5 is a detailed circuit diagram for explaining one example of the core voltage generator depicted in FIG. 4.

FIG. 5 is a detailed circuit diagram for explaining one example of the core voltage generator 200 depicted in FIG. 4.

With reference to FIG. 5, the core voltage generator 200 is constituted by the reference voltage generator 200c for generating a reference voltage VREF, the standby internal voltage generator 200a, and the first and the second active internal voltage generators 210 and 220.

Figure 3:
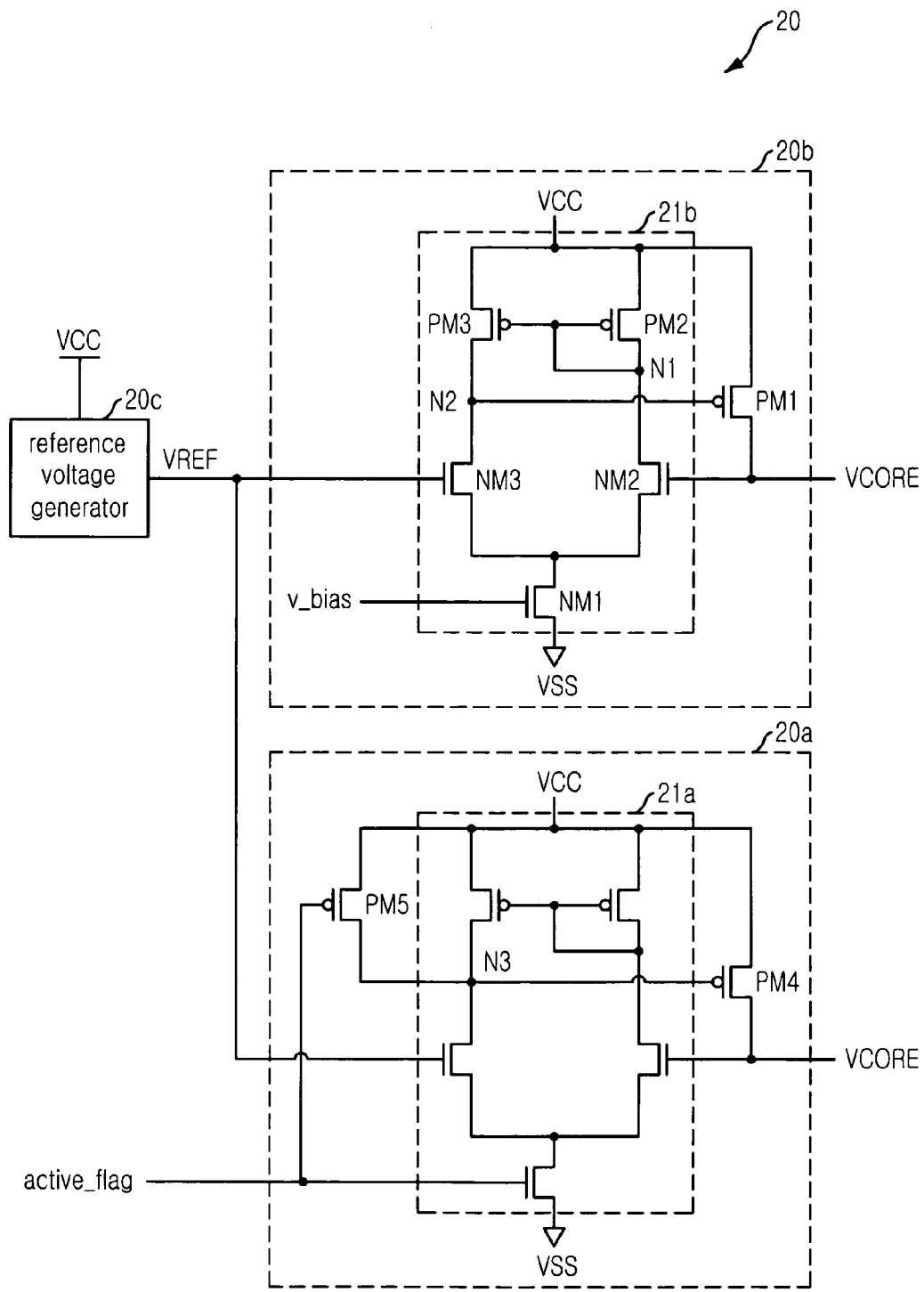
FIG. 3 is a detailed circuit diagram for explaining the core voltage generator depicted in FIG. 2.

In the above configuration, since the standby internal voltage generator 200a and the first active internal voltage generator 210 are substantially identical to those of the prior art, a detailed description thereon will be omitted here. But, the sum of voltages supplied from the first and the second active internal voltage generators 210 and 220 should be the same as the voltage from the conventional active internal voltage generator 20a shown in FIG. 3. Namely, if the active internal voltage generator 20a in the prior art has a driving force of, for example, '100', the first active internal voltage generator 210 of the present invention has a driving force of '100-a' and the second active internal voltage generator 220 has a driving force of 'a'. Here, 'a' represents a driving force that is unnecessarily consumed in the prior art for a certain time period after the active signal active_flag is activated to a logic high level.

Hereinafter, the second active internal voltage generator 220 that is closely related to the present invention will be described in detail. The second active internal voltage generator 220 includes an active signal sensing circuit 221 and an internal voltage generator 222.

The active signal sensing circuit 221 can be constituted by a pulse generator (hereinafter, designated by the same reference numeral as the active signal sensing circuit) for generating a pulse signal PULSE that becomes active to a logic high level only for a certain time period.

The pulse generator 221 can be composed of a delay circuit 221a consisting of an inverter chain accepting the active signal active_flag, and an output circuit 221b for receiving an output signal of the delay circuit 221a and the active signal active_flag and outputting the pulse signal PULSE.

The output circuit 221b is composed of an inverter INV1 receiving an output signal of the delay circuit 221a, a NAND gate NAND1 accepting the active signal active_flag and an output signal of the inverter INV1, and an inverter INV2 for receiving an output signal of the NAND gate NAND1 and outputting the pulse signal PULSE. The pulse signal PULSE so generated is then applied to the internal voltage generator 222 as an enable signal.

The pulse generator 221 as described above delays the active signal active_flag by a certain time regardless of an internal clock and then outputs the pulse signal PULSE. optionally, the pulse signal PULSE may be generated by taking and dividing the internal clock through another configuration. Since this is obvious to those skilled in the art, a concrete description thereon will be omitted here.

The internal voltage generator 222 is identical in constitution to the first active internal voltage generator 210 except that it receives the pulse signal PULSE outputted from the active signal sensing circuit 221 as the enable signal, instead of the active signal active_flag to the first active internal voltage generator 210 as the enable signal.

To be more specific, the internal voltage generator 222, in response to the pulse signal PULSE of a logic high level from the active signal sensing circuit 221, is composed of a voltage comparator 222a for comparing the reference voltage VREF with the core voltage VCORE to output a logic low level if the core voltage VCORE is lower than the reference voltage VREF, a pull-up driver PM6 for performing a pull-up driving in response to an output signal of the voltage comparator 220a, and a switch PM7 for turning off the pull-up driver PM6 in response to the pulse signal PULSE of a logic low level.

The voltage comparator 220a is composed of an NMOS transistor NM4 for taking the pulse signal PULSE via its gate, an NMOS transistor NM5 connected between a node N4 and the NMOS transistor NM4 for receiving the core voltage VCORE via its gate, a PMOS transistor PM8 coupled between an external voltage end VCC and the node N4 for accepting a voltage level of the node N4 via its gate, a PMOS transistor PM9 coupled between the external voltage end VCC and a node N5 for taking the voltage level of the node N4 via its gate, and an NMOS transistor NM6 connected between the node N5 and the NMOS transistor NM4 for receiving the reference voltage VREF via its gate.

The pull-up driver PM6 is composed of a PMOS transistor connected between the external voltage end VCC and the core voltage end for receiving a voltage of an output end of the voltage comparator 222a, i.e., the node N5 via its gate. And, the switch PM7 is composed of a PMOS transistor connected between the external voltage end VCC and the output end (a node N5) of the voltage comparator 222a for receiving the pulse signal PULSE via its gate.

Now, an operation of the core voltage generator 200 according to the present invention will be described in detail. First of all, in response to the enable signal V_bias during the standby operation, the standby internal voltage generator 200a is enabled, thus maintaining the core voltage VCORE of a certain electric potential. Meanwhile, during the active operation, the first active internal voltage generator 210 is driven in response to the active signal active_flag, and the second active internal voltage generator 220 is driven in response to the pulse signal PULSE of a logic high level from the active signal sensing unit 221. Thus, the core voltage VCORE of a larger driving force can be secured. After a certain time period, the second internal voltage generator 220 is turned off by the pulse signal PULSE that has transited to a logic low level.

Figure 1:
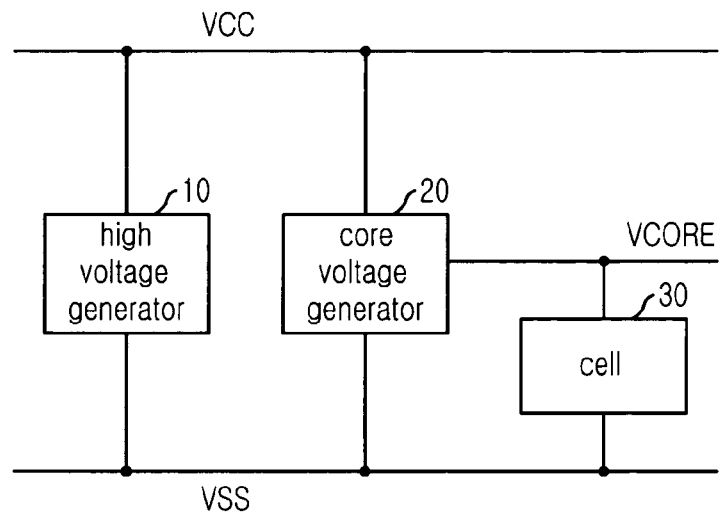
FIG. 1 shows a block diagram for describing a conventional internal voltage generation circuit.
Figure 2:
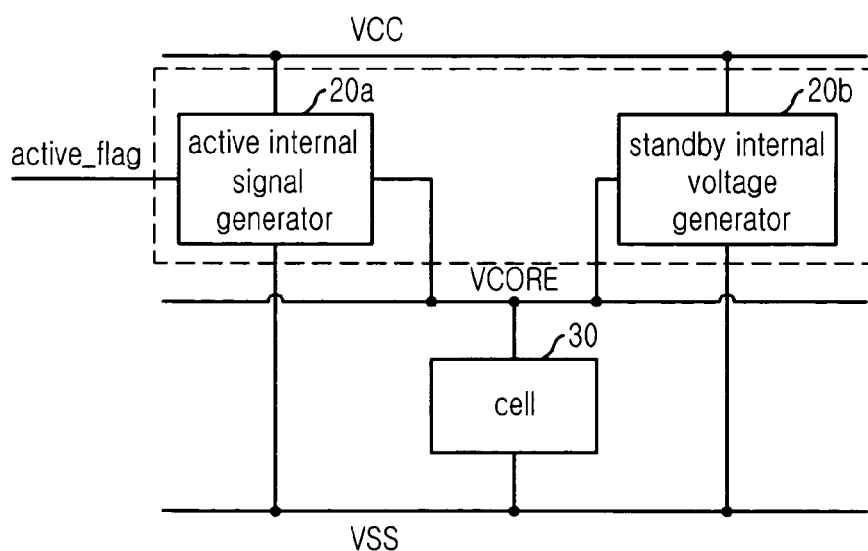
FIG. 2 is a detailed block diagram for describing the core voltage generator depicted in FIG. 1.

In other words, the supply capability of the active internal voltage generator 20a of the prior art shown in FIG. 2 is the same as the sum of the supply capabilities of the first and the second active internal voltage generators 210 and 220 of the present invention shown in FIG. 5. As a result, the previous unnecessary power consumption can be reduced by turning off the second active internal voltage generator 220 after a certain time period.

According to the current operation standard of the semiconductor device, there is a timing standard called 'tRAS' 'tRAS' is to facilitate the operation of the semiconductor device, by an active command, by guaranteeing a certain time 'tRAS' after receipt of the external active command. The semiconductor device draws much current from the core voltage VCORE for the time 'tRAS'.

By applying the pulse signal PULSE activated for 'tRAS' as the enable signal of the second active internal voltage generator 222 during the active operation, it can be divided into a section where the first and the second active internal voltage generators 221 and 222 are driven and a section where only the first active internal voltage generator 221 is driven during the active operation. Therefore, the first and the second active internal voltage generators 221 and 222 are driven for 'tRAS' during which power consumption through the core voltage VCORE is large, thereby securing a required driving force, while only the first active internal voltage generator 221 is driven after 'tRAS', thereby guaranteeing a driving force with no unnecessary power consumption.

As a result, the present invention can remove unnecessary power consumption during an active operation, so that the semiconductor device can be operated at a low power.

While the present invention has been described with respect to the specific embodiments, it will be apparent to those skilled in the art that various changes and modifications may be made without departing from the spirit and scope of the invention as defined in the following claims.

What is claimed is:

1. An internal voltage generation circuit for use in a semiconductor device, comprising:
  a standby internal voltage generator which is to be driven during a standby operation and an active operation, and supplies a voltage to an internal voltage end;
  a first active internal voltage generator for supplying a voltage to the internal voltage end in response to an active signal being activated during the active operation; and
  a second active internal voltage generator which is to be driven only for a predetermined time period in response to the active signal, and supplies a voltage to the internal voltage end,
  wherein the second active internal voltage generator includes:
  an active signal sensing circuit for sensing the active signal; and an internal voltage generator for generating a voltage in response to an output signal of the active signal sensing circuit, wherein the active signal sensing circuit is provided with a pulse generator for generating a pulse signal which becomes active only for the predetermined time period after receiving the active signal, wherein the pulse generator includes:

a delay circuit for taking and delaying the active signal; and an output circuit for receiving the active signal and an output signal of the delay circuit to provide the pulse signal.

2. The internal voltage generation circuit as recited in claim 1, wherein the delay circuit is constituted by an inverter chain.

3. The internal voltage generation circuit as recited in claim 1, wherein the pulse generator divides an internal clock signal in response to the active signal to output the pulse signal.

4. The internal voltage generation circuit as recited in claim 1, wherein the internal voltage generator includes:

a voltage comparison circuit for comparing the voltage supplied to the internal voltage end with a reference voltage in response to an output signal of the active signal sensing circuit;

a pull-up driver for supplying an external voltage to the internal voltage end in response to an output signal of the voltage comparison circuit; and a switch for turning off the pull-up driver in response to an output signal of the active signal sensing circuit.

5. The internal voltage generation circuit as recited in claim 4, wherein the voltage comparison circuit includes:

a voltage comparator composed of a current mirror type differential amplifier receiving the voltage to the internal voltage end and the reference voltage; and a MOS transistor for taking an output signal of the active signal sensing circuit via a gate.

6. The internal voltage generation circuit as recited in claim 5, wherein the pull-up driver is provided with a MOS transistor which is connected between the internal voltage end and an external voltage end, and takes an output signal of the voltage comparator via a gate.

7. The internal voltage generation circuit as recited in claim 4, wherein the switch is provided with a MOS transistor which is connected between an output end of the voltage comparison circuit and an external voltage end, and receives an output signal of the active signal sensing circuit via a gate.

8. The internal voltage generation circuit as recited in claim 1, wherein the predetermined time period is tRAS.

9. An internal voltage generation circuit, comprising:

a first active internal voltage generator for supplying an internal voltage during an active operation; and a second active internal voltage generator for supplying the internal voltage for a predetermined time included in the active operation, wherein the second active internal voltage generator includes:

an active signal sensing circuit for sensing the active signal; and an internal voltage generator for generating a voltage in response to an output signal of the active signal sensing circuit, wherein the active signal sensing circuit is provided with a pulse generator for generating a pulse signal which becomes active only for the predetermined time period after receiving the active signal, wherein the pulse generator includes:

a delay circuit for taking and delaying the active signal; and an output circuit for receiving the active signal and an output signal of the delay circuit to provide the pulse signal.

10. The internal voltage generation circuit as recited in claim 9, wherein the delay circuit is constituted by an inverter chain.

11. The internal voltage generation circuit as recited in claim 9, wherein the pulse generator divides an internal clock signal in response to the active signal to output the pulse signal.

12. The internal voltage generation circuit as recited in claim 9, wherein the internal voltage generator includes:

a voltage comparison circuit for comparing the voltage supplied to the internal voltage end with a reference voltage in response to an output signal of the active signal sensing circuit;

a pull-up driver for supplying an external voltage to the internal voltage end in response to an output signal of the voltage comparison circuit; and a switch for turning off the pull-up driver in response to an output signal of the active signal sensing circuit.

13. The internal voltage generation circuit as recited in claim 12, wherein the voltage comparison circuit includes:

a voltage comparator composed of a current mirror type differential amplifier receiving the voltage to the internal voltage end and the reference voltage; and a MOS transistor for taking an output signal of the active signal sensing circuit via a gate.

14. The internal voltage generation circuit as recited in claim 13, wherein the pull-up driver is provided with a MOS transistor which is connected between the internal voltage end and an external voltage end, and takes an output signal of the voltage comparator via a gate.

15. The internal voltage generation circuit as recited in claim 12, wherein the switch is provided with a MOS transistor which is connected between an output end of the voltage comparison circuit and an external voltage end, and receives an output signal of the active signal sensing circuit via a gate.

16. The internal voltage generation circuit as recited in claim 9, wherein the predetermined time period is tRAS.

* * * * *